United States Patent
Liu et al.

(12)

(10) Patent No.: US 6,444,136 B1
(45) Date of Patent: Sep. 3, 2002

(54) FABRICATION OF IMPROVED LOW-K DIELECTRIC STRUCTURES

(75) Inventors: Q. Z. Liu; Bin Zhao, both of Irvine, CA (US)

(73) Assignee: Newport Fab, LLC, Newport Beach, CA (US)

( * ) Notice: Subject to any disclaimer, the term of this patent is extended or adjusted under 35 U.S.C. 154(b) by 0 days.

(21) Appl. No.: 09/559,292

(22) Filed: Apr. 25, 2000

(51) Int. Cl.[7] .................. B44C 1/22; H01L 21/4763
(52) U.S. Cl. ..................... 216/62; 216/17; 216/67; 216/18; 438/725; 438/637
(58) Field of Search ............... 216/17, 18, 67, 216/62; 438/725, 637

(56) References Cited

U.S. PATENT DOCUMENTS

| | | | | |
|---|---|---|---|---|
| 5,609,925 A | * | 3/1997 | Camilletti et al. | 427/503 |
| 5,970,376 A | * | 10/1999 | Chen | 438/637 |
| 6,025,264 A | * | 2/2000 | Yew et al. | 438/627 |
| 6,121,150 A | * | 9/2000 | Avanzino et al. | 438/692 |
| 6,235,453 B1 | * | 5/2001 | You et al. | 430/329 |
| 6,265,320 B1 | * | 7/2001 | Shi et al. | 438/725 |
| 6,271,127 B1 | * | 8/2001 | Liu et al. | 438/638 |

* cited by examiner

*Primary Examiner*—Alexander Markoff
*Assistant Examiner*—Shamim Ahmed
(74) *Attorney, Agent, or Firm*—Farjami & Farjami LLP (57) ABSTRACT

Fabrication of improved low-k dielectric structures is disclosed. Low-k dielectric structures are fabricated while overcoming the otherwise existing problems associated with the use of low-k dielectric materials. In one embodiment, the physical properties of a low-k dielectric material is modified by exposing the low-k dielectric material to electron beams. The exposed portion of the low-k dielectric material becomes easier to etch and clean and exhibits greater mechanical strength and a reduction in absorption of moisture. In another embodiment, a number of incremental exposure and etch steps are performed to fabricate a desired structure. In yet another embodiment, the steps of exposure of a low-k dielectric material are combined with the etch steps. The exposure and the etching of the low-k dielectric material are performed concurrently in the same system. In still another embodiment, a single exposure and a single etch step are utilized to fabricate a desired structure. All the disclosed embodiments can be practiced by exposing the low-k dielectric material to ion beams instead of electron beams.

12 Claims, 9 Drawing Sheets

FABRICATION OF IMPROVED LOW-K DIELECTRIC STRUCTURES

BACKGROUND OF THE INVENTION

1. Field of the Invention

The present invention is generally in the field of fabrication of structures in semiconductor chips. In particular, the invention is in the field of fabrication of structures using low dielectric constant ("low-k") material.

2. Background Art

It is known in the art that a dielectric material used in the fabrication of integrated circuit structures should have a low dielectric constant ("low-k"). The advantages of using low dielectric constant material in such structures are well-known. One of the advantages is a reduction in the inter-line coupling capacitance between metal lines. Such capacitance causes "noise" or "crosstalk" between metal lines. Another advantage is the reduction of capacitance between different layers of interconnect and also a reduction of capacitance between a layer of interconnect to the substrate. It is known in the art that a lower capacitance will reduce the interconnect metal line delay, i.e. the "RC" delay. Another advantage is the significant decrease in power consumption resulting from the lower capacitance since the amount of power consumed is directly proportional to the capacitance. Thus, it is generally appreciated in the art that the use of low dielectric constant material in the fabrication of integrated circuit structures is desirable for the reasons mentioned above.

Silicon dioxide is one of the dielectric materials used in the fabrication of integrated circuit structures because of its desirable features such as adequate hardness, and ease of cleaning and etching for even small feature sizes. However, the dielectric constant value of silicon dioxide is about 4.0. It is generally appreciated in the art that this dielectric constant value is too high. Thus, there is a drive to utilize materials with lower dielectric constant values in the fabrication of integrated circuit structures.

Polymers with a dielectric constant value of 2.5 or 3.0 are achievable. One method of reducing the dielectric constant of some polymer films is to increase the porosity of the polymer by introducing air into the pores of the polymer. Since the dielectric constant value of air is 1.0, introducing air into the material decreases the dielectric constant value of the material.

However, there are also problems associated with the use of lower dielectric constant material in the fabrication of integrated circuit structures. For example, etching low-k dielectric is difficult. Most low-k dielectrics are easily damaged by the etch chemistry or plasma. As an example, hydrogen silsesquioxane (also referred to as "HSQ") is a low-k dielectric which has been used in the fabrication of integrated circuits. However, the silicon-hydrogen bond in hydrogen silsesquioxane is weak and can easily be broken. Once the silicon-hydrogen bond is broken, the remaining material exhibits a tendency to absorb moisture. Also, during etching of most low-k dielectrics, polymers are generated which are hard to clean without etching away the low-k dielectric itself.

In addition, most low-k dielectrics have poor mechanical strength. One reason poor mechanical strength is undesirable is because low-k dielectric may not withstand chemical mechanical polishing ("CMP"). It is known in the art that the CMP process is usually used to remove excess metal over the wafer surface after the metal has been used to create damascene structures.

Thus, problems associated with the use of a low-k dielectric material in the fabrication of integrated circuit structures include (a) difficulty in etching and cleaning low-k dielectric materials; (b) undesirable absorption of moisture; and (c) low mechanical strength of low-k dielectric materials.

It is known that when dielectric material is exposed to electron beams (E-beams) or ion beams (I-beams), the properties of the dielectric material can be changed. For example, a paper entitled "E-Beam Curing Process of Low-K Dielectrics for unlanded vias in 0.25 $\mu$m CMOS Technology" by David Feiler, Q. Z. Liu, and Maureen R. Brongo discusses an E-beam curing process of low-k dielectrics for unlanded vias in a CMOS technology. It is shown in that paper that the properties of the low-k dielectric can be modified so as to prevent unlanded vias from penetrating too deeply into the underlying low-k dielectric.

A second paper entitled "A Novel and Low Thermal Budget Planarization Scheme for Pre- and Inter-Metal Dielectric Using HSQ (Hydrogen Silsesquioxane) Based SOG with Electron-Beam Curing for 256 Mbit DRAM and Beyond" by Juseon Goo, Hae-Jeong Lee, Seong Ho Kim, Ji Hyun Choi, Byung Keun Hwang, Ho-Kyu Kang, and Moon Yong Lee discusses a finding that hydrogen silsesquioxane can be cured and densified with exposure to E-beams.

A third paper entitled "Integration of Low k Spin-on Polymer (SOP) Using Electron Beam Cure for Non-Etch-Back Application" by Jane C. M. Hui, Yi Xu, Chow Yeog Foong, Liao Marvin, Lin Charles, and Lin Yih Shung discusses an E-beam curing process for spin-on glass materials in relation to spin-on polymer non-etch-back processing such as "via poisoning." It is shown that after E-beam exposure, the tested materials' properties had changed, e.g. lower moisture content, higher film density and higher resistance were achieved.

A fourth paper entitled "Effects of Electron Beam Exposure on Poly(arylene Ether) Dielectric Films" by J. S. Drage, J. J. Yang, D. K. Choi, R. Katsanes, K. S. Y. Lau, S.-Q. Wang, L. Forester, P. E. Schilling, and M. Ross discusses the effects of E-beam exposure on chemical and physical properties of an organic dielectric film. Specifically, solvent resistance, glass transition temperature, and dielectric constant of the film are studied. The results of the study indicate that E-beam curing does not raise the dielectric constant compared to thermally-cured film.

In addition to the above-discussed papers, there are patents utilizing methods that alter the physical properties of dielectric materials using ion implantation. One such patent is U.S. Pat. No. 5,496,776 entitled "Spin-On Glass Planarization Process With Ion Implantation." This patent discloses a method for planarizing an integrated circuit surface with a spin-on-glass sandwich layer, where the entire surface area of spin-on-glass exposed within a via etched through the spin-on-glass sandwich layer is not susceptible to sorption and outgassing of moisture. The patent also teaches a method of planarizing an integrated circuit surface which does not result in metallurgy and high resistivity problems associated with metallic interconnections through vias etched through the planarizing layer. One step in these methods is the implantation of ions into and through a spin-on-glass layer under various conditions. This method eliminates the need for an etch back process for the spin-on-glass exposed within the etched vias prior to metal deposition into those etched vias.

U.S. Pat. No. 5,192,697 entitled "SOG Curing By Ion Implantation" discloses among other things, a method of curing the spin-on-glass layer of an article which results in similar or better dielectric strength than a temperature cure method. Ions, such as argon or arsenic are implanted into the spin-on-glass layer of an article. The action of the ions moving through the spin-on-glass layer causes heating. This heating cures the spin-on-glass layer of the article.

U.S. Pat. No. 5,413,953 entitled "Method Of Planarizing An Insulator On A Semiconductor Substrate Using Ion Implantation" discloses an improved process for fabricating planar field oxide structures on a silicon substrate. The patent also discloses an improved process for fabricating planar Field Oxide (FOX) isolation structures and an improved process for fabricating planar insulating layers over patterned conducting layers by ion implantation and etching.

As part of these processes, the substrate surface is implanted with arsenic or phosphorus ions. This ion implantation results in a damaged oxide layer, which etches approximately 2 to 4 times faster than the undamaged portion of the field oxide. As a result of faster etching of the damaged portion of the field oxide, the desired structures can be more easily fabricated.

Although it is desirable to use low-k dielectrics for the reasons stated above, the use of low-k dielectrics is accompanied by various problems also discussed above. The above-discussed papers and patents have not overcome a number of problems associated with the use of low-k dielectrics. Accordingly, there is a need in the art for using low-k dielectric materials in the fabrication of integrated circuit structures while overcoming the various problems resulting from the use of low-k dielectric materials. For example, there is need to use low-k dielectric material in the recently developed damascene fabrication processes while overcoming the various problems resulting from the use of such material.

SUMMARY OF THE INVENTION

The present invention teaches fabrication of improved low-k dielectric structures. According to the present invention, low-k dielectric structures are fabricated while overcoming the otherwise existing problems associated with the use of low-k dielectric materials. The invention resolves the difficulties in etching and cleaning low-k dielectric materials, the undesirable absorption of moisture by low-k dielectric materials, and the low mechanical strength of low-k dielectric materials.

In one embodiment of the invention, the physical properties of a low-k dielectric material is modified by exposing the low-k dielectric material to electron beams. The exposed portion of the low-k dielectric material becomes easier to etch and clean and exhibits greater mechanical strength and a reduction in absorption of moisture. In another embodiment of the invention, a number of incremental exposure and etch steps are performed to fabricate a desired structure.

In yet another embodiment of the invention, the steps of exposure of a low-k dielectric material are combined with the etch steps. The exposure and the etching of the low-k dielectric material are performed concurrently in the same system. In still another embodiment, the invention utilizes a single exposure and a single etch step to fabricate a desired structure. All embodiments of the invention can be practiced by exposing the low-k dielectric material to ion beams instead of electron beams.

DETAILED DESCRIPTION OF THE INVENTION

The present invention is directed to fabrication of improved low-k dielectric structures. The following description contains specific information pertaining to the implementation of the present invention. One skilled in the art will recognize that the present invention may be implemented in a manner different from that specifically discussed in the present application. Moreover, some of the specific details of the invention are not discussed in order to not obscure the invention. The specific details not described in the present application are within the knowledge of a person of ordinary skill in the art.

The drawings in the present application and their accompanying detailed description are directed to merely example embodiments of the invention. To maintain brevity, other embodiments of the invention which use the principles of the present invention are not specifically described in the present application and are not specifically illustrated by the present drawings.

In the present application, the invention is explained by reference to a damascene process. The term "damascene" is derived from the ancient in-laid metal artistry originated in Damascus. According to the damascene process, trenches are cut into the dielectric and then filled with metal. Then excess metal over the wafer surface is removed to form desired interconnect metal patterns within the trenches.

It is noted that although the present application discloses a method for fabricating interconnects in a damascene process using a dielectric with a low dielectric constant, the invention is also applicable to fabricating interconnects using a dielectric with a low dielectric constant in semiconductor processes other than the damascene process.

The present invention maintains the advantages of the low dielectric constant material such as lower inter-line coupling capacitance, lower inter-layer coupling capacitance, lower "RC" delay, and lower power due to lower capacitance. At the same time the disadvantages of the low dielectric constant material affecting the fabrication of integrated circuit structures, such as its low mechanical strength and the vulnerability of low-k dielectric to the etch chemistry are overcome by the method and structure disclosed in the present invention. Thus, the present invention makes low dielectric constant material easier to etch and to clean.

One embodiment of the invention is shown in FIGS. 1 through 11, which illustrate various process steps in the present embodiment of the invention by showing the cross sections of the resulting structures after each process step.

Figure 1:
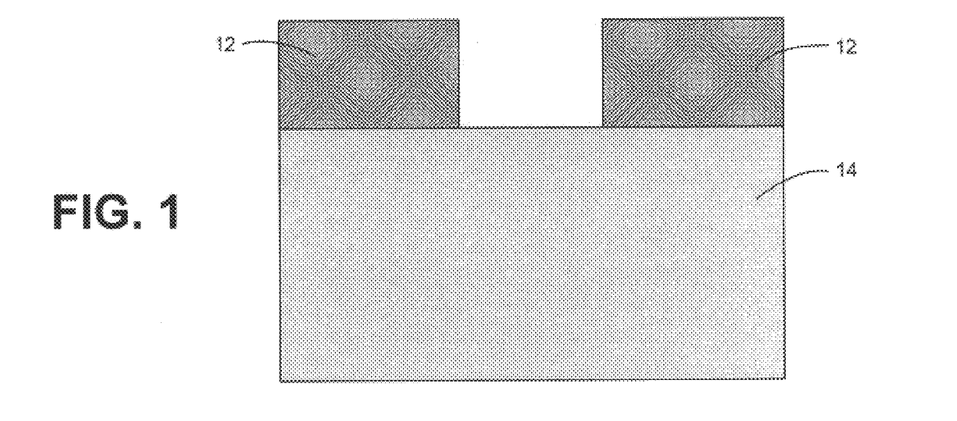
FIG. 1 shows an initial low-k dielectric structure including a photoresist pattern.
Figure 2:
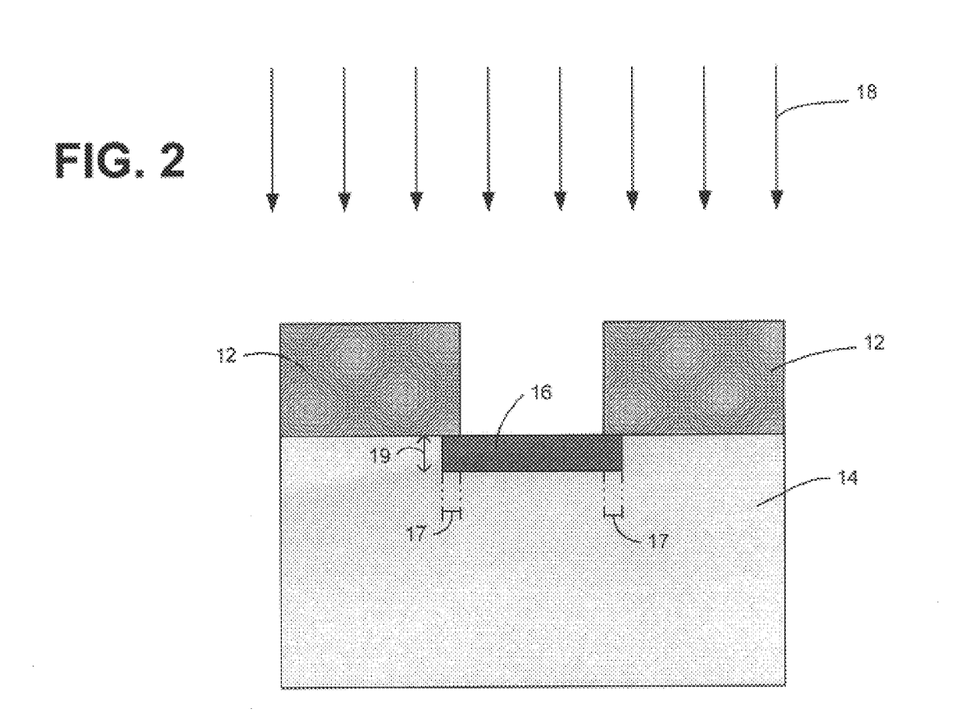
FIG. 2 illustrates an incremental exposure step where the low-k dielectric is exposed to electron beams.

As the present embodiment of the invention's first step in fabricating damascene interconnects using a dielectric with a low dielectric constant, FIG. 1 shows photoresist 12 patterned on top of low-k dielectric 14. Photoresist 12 is used to pattern a desired structure in low-k dielectric 14. In the present embodiment of the invention, low-k dielectric 14 can be hydrogen silsesquioxane (HSQ). FIG. 2 shows the application of electron beams (E-beams) 18 to low-k dielectric 14. By use of E-beams 18, physical properties of low-k dielectric 14 are modified. E-beams 18 break the bond between the silicon and hydrogen in hydrogen silsesquioxane, allowing the hydrogen to "escape". The material that remains after exposure to E-beams 18 is referred to as "modified low-k dielectric" or simply as "modified dielectric material" in the present application. The portion of the initial low-k dielectric 14 that is not affected by E-beams 18 is referred to as an "unmodified low-k dielectric" or simply as "unmodified dielectric material" in the present application. As will be explained in a later section of this application, modified low-k dielectric 16 which remains after application of E-beams 18 is substantially easier to etch and to clean than the initial low-k dielectric 14. This ease of etching and cleaning results from the fact that the initial low-k dielectric 14 becomes harder after exposure to E-beams 18.

At the outset, it is noted that it is desirable to achieve the modified low-k material using the invention's method in a direction perpendicular to E-beams 18 incident on low-k dielectric 14. However, as a result of the invention's method, the low-k dielectric 14 under the photoresist is modified laterally to a certain extent. This phenomenon is referred to as "lateral encroachment" in the present application. It is desirable to limit lateral encroachment of modified low-k dielectric 16 into low-k dielectric 14 because modified low-k dielectric 16 has a higher dielectric constant than low-k dielectric 14. As discussed above, the higher dielectric constant of the modified low-k dielectric 16 increases the intra-line capacitance. As also discussed above, this results in undesirable "noise" between lines, an increased "RC" delay, and higher power consumption.

In a manner explained below, the present embodiment limits lateral encroachment. In the present embodiment E-beams 18 are used to modify low-k dielectric 14 in a number of incremental exposure steps where each incremental exposure step is followed by a corresponding incremental etch step. FIGS. 2 through 9 illustrate the above-mentioned incremental exposure and etch steps that are taken in order to modify low-k dielectric 14 to arrive at the final structure of the invention. The exemplary number of incremental exposure steps discussed to explain the present embodiment of the invention is four. Likewise, the corresponding number of incremental etch steps discussed to explain the present embodiment is also four. It is appreciated by a person of ordinary skill in the art that the number of incremental exposure and etch steps can be varied without departing from the spirit and scope of the present embodiment of the invention. For example, the number of incremental exposure and etch steps can be eight or greater.

As stated above, after the first of four incremental exposure steps, low-k dielectric 14 is modified and becomes modified low-k dielectric 16 to a certain depth. The lateral encroachment can be about one-half the depth of modified low-k dielectric 16 for this incremental exposure step. The present embodiment of the invention limits the lateral encroachment of modified low-k dielectric 16 into low-k dielectric 14 resulting from an E-beam incremental exposure step.

The present embodiment of the invention uses low-power E-beams 18. Lower power E-beams are used to modify low-k dielectric 14 in a number of incremental exposure steps. The lower power E-beams permit this embodiment of the invention to modify low-k dielectric 14 in small incremental steps since, due to their relatively low power, the E-beams do not penetrate as deeply as they otherwise would.

Referring to FIG. 2, a specific example of the present embodiment of the invention is now discussed. FIG. 2 illustrates the first of four incremental exposure steps in the present exemplary embodiment. During this step low-k dielectric 14 is exposed to a small amount of E-beams 18 generated by a low power E-beam source. The area of low-k dielectric 14 which is exposed to E-beams 18 is also referred to as a "target area" in the present application. The E-beam source is not shown in any of the Figures. However, commercial E-beam sources are readily available and in fact one advantage of utilizing an E-beam source in the present embodiment is that, because of their wide availability, E-beam sources are relatively inexpensive. Due to exposure to E-beams 18, low-k dielectric 14 is modified down to a certain depth. This depth achieved as a result of the first incremental exposure step is generally referred to in FIG. 2 by numeral 19. Thus, depth 19 is the depth of modified low-k dielectric 16 achieved at the end the first exposure step.

As discussed above, as a by-product of the incremental exposure step, modified low-k dielectric 16 can encroach laterally under photoresist 12. The amount of lateral encroachment of modified low-k dielectric 16 is generally pointed to by numeral 17 in FIG. 2 and the modified low-k dielectric which is extended under photoresist 12 is referred to as the laterally modified low-k in the present application.

In the present example, after the first of four incremental exposure steps, depth 19 of modified low-k dielectric 16 is about 0.1 microns. In this example, lateral encroachment 17 of modified low-k dielectric 16 under photoresist 12 would be about one-half of the 0.1 microns depth, i.e., about 0.05 microns.

Figure 3:
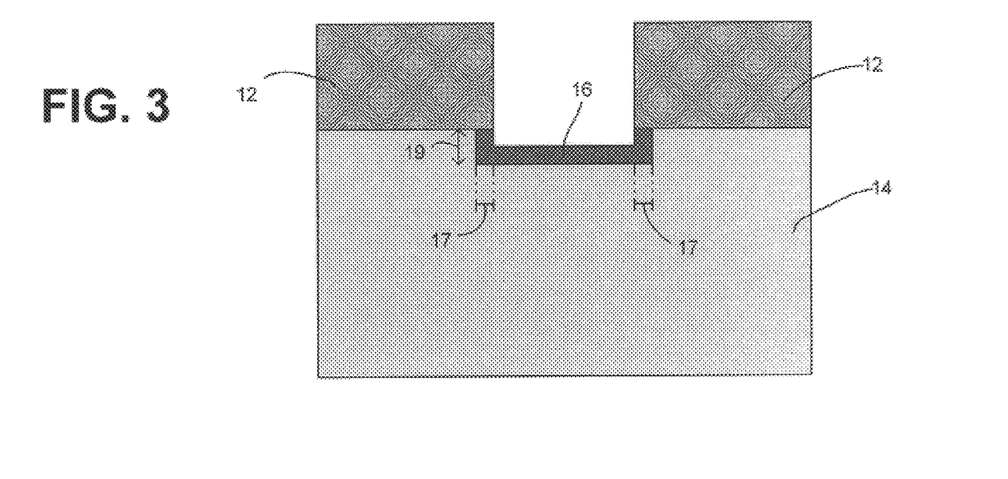
FIG. 3 illustrates an incremental etch step where the modified low-k dielectric is etched.

Referring to FIG. 3, the first of four incremental etch steps is then performed on the structure achieved at the end of the first incremental exposure step. The result of this incremental etch step is shown in FIG. 3. The first incremental etch step removes most of modified low-k dielectric 16 in the vertical direction, but does not remove a significant amount of the laterally modified low-k dielectric 16 which has encroached under photoresist 12 (the amount of such lateral encroachment was referred to by numeral 17 in FIG. 2). The etchant used in this first incremental etch step as well as the remaining incremental etch steps in the present embodiment is a fluorine based plasma, for example, $CF_4$ or $CH_2F_2$. The portion of modified low-k dielectric 16 which is removed during an incremental etch step is referred to as an "etched portion" in the present application.

Figure 4:
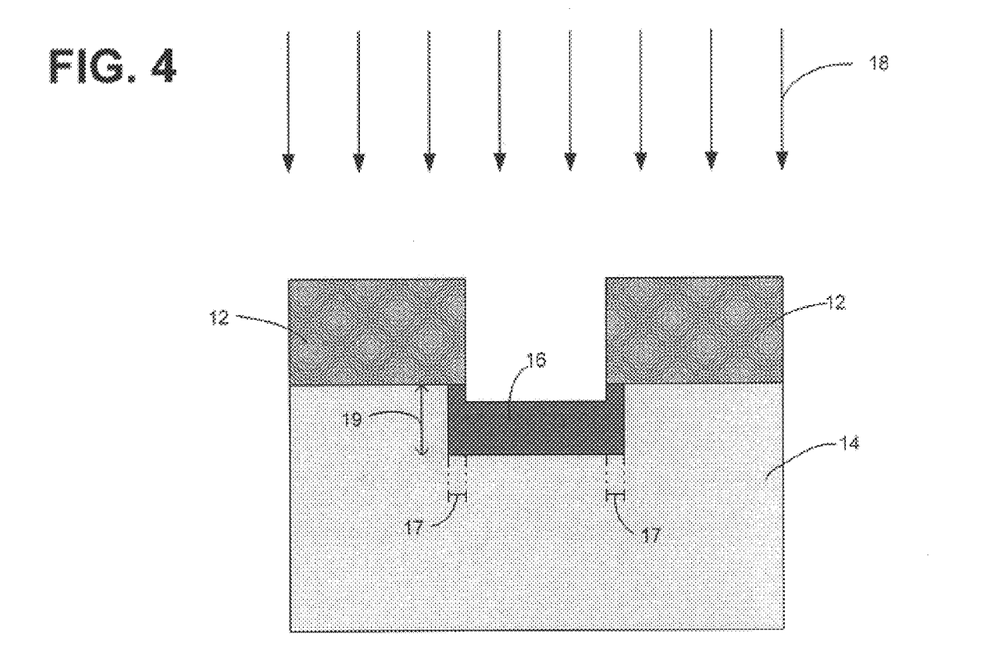
FIG. 4 illustrates an incremental exposure step where the low-k dielectric is exposed to electron beams.

Referring to FIG. 4, a second incremental exposure step is performed. As shown in FIG. 4, after the second of four incremental exposure steps, depth 19 of modified low-k dielectric 16 increases to about 0.2 microns, i.e., depth 19 has increased by another 0.1 microns. However, as shown in FIG. 4, lateral encroachment 17 has remained constant at about 0.05 microns.

Figure 5:
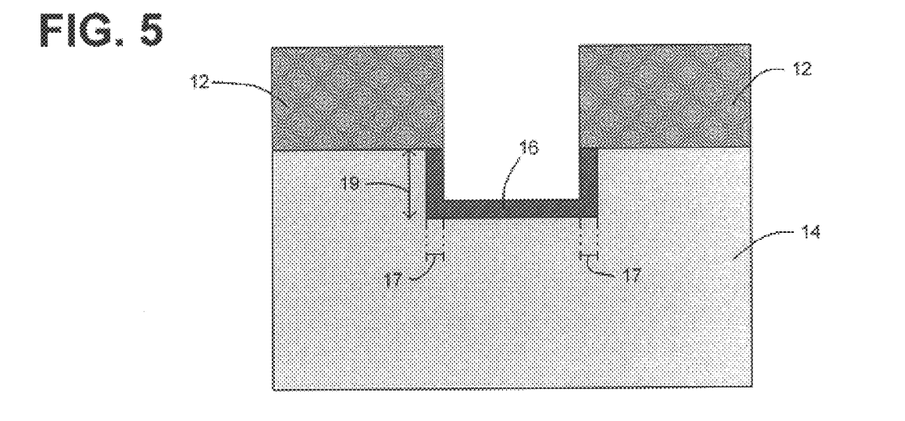
FIG. 5 illustrates an incremental etch step where the modified low-k dielectric is etched.

Referring to FIG. 5, the second of four incremental etch steps is then performed on the structure achieved at the end of the second incremental exposure step. The result of this incremental etch step is shown in FIG. 5. The second incremental etch step removes most of modified low-k dielectric 16 in the vertical direction, but does not remove a significant amount of the laterally modified low-k dielectric 16 which has encroached under photoresist 12 (the amount of such lateral encroachment was referred to by numeral 17 in FIGS. 2 and 4).

Figure 6:
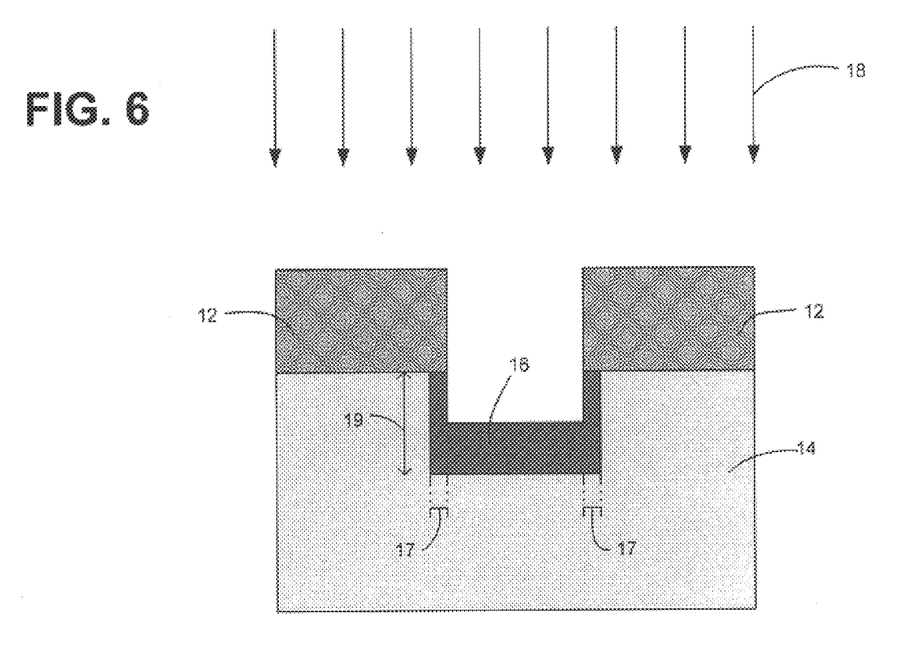
FIG. 6 illustrates an incremental exposure step where the low-k dielectric is exposed to electron beams.

Referring to FIG. 6, after the third of four incremental exposure steps, depth 19 of modified low-k dielectric 16 is about 0.3 microns, i.e., depth 19 has increased by another 0.1 microns. However, lateral encroachment 17 has still remained constant at about 0.05 microns.

Figure 7:
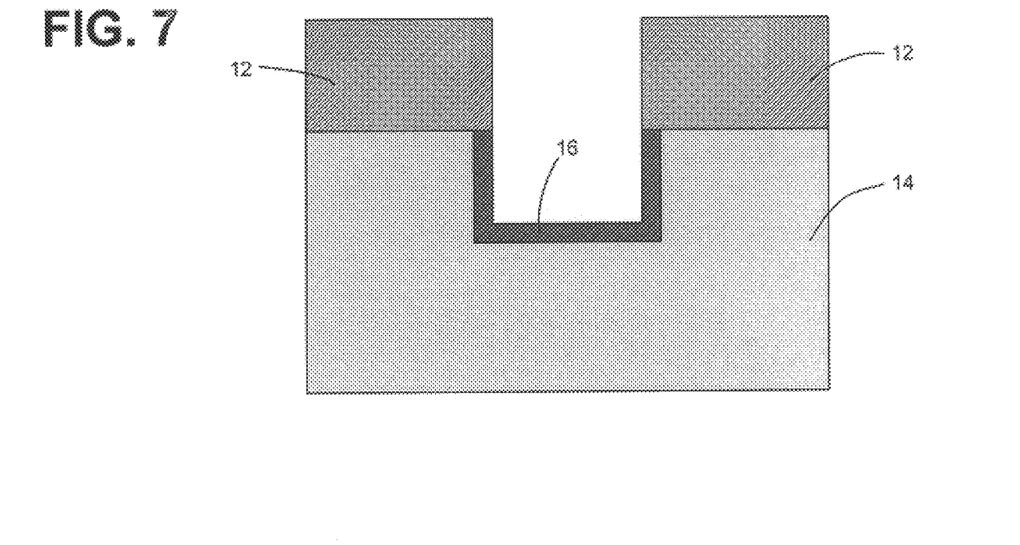
FIG. 7 illustrates an incremental etch step where the modified low-k dielectric is etched.

Referring to FIG. 7, the third of four incremental etch steps is then performed on the structure achieved at the end of the third incremental exposure step. The result of this incremental etch step is shown in FIG. 7. As with the previous incremental etch steps, the third incremental etch step removes most of modified low-k dielectric 16 in the vertical direction, but does not remove a significant amount of the laterally modified low-k dielectric 16 which has encroached under photoresist 12 (the amount of such lateral encroachment was referred to by numeral 17 in FIGS. 2, 4, and 6).

Figure 8:
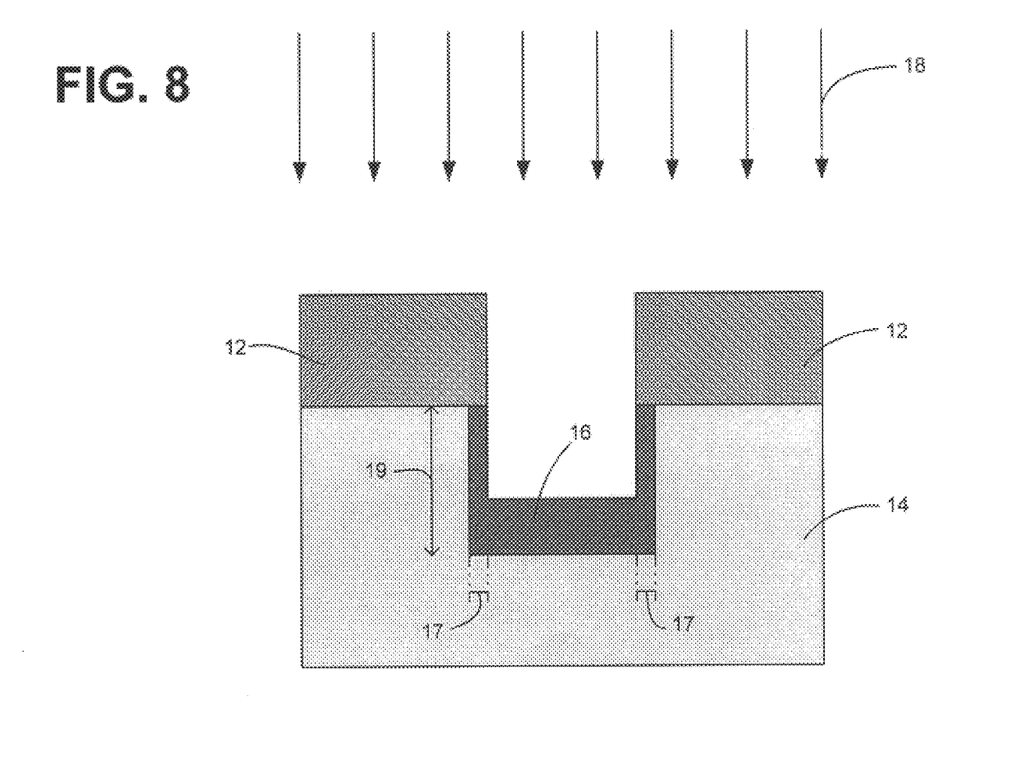
FIG. 8 illustrates an incremental exposure step where the low-k dielectric is exposed to electron beams.

FIG. 8 shows the last incremental exposure step in the present example implementation of the present embodiment of the invention. Referring to FIG. 8, after the last of four incremental exposure steps, depth 19 of modified low-k dielectric 16 is about 0.4 microns, i.e., depth 19 has increased by another 0.1 microns. However, lateral encroachment 17 has remained constant at about 0.05 microns.

Figure 9:
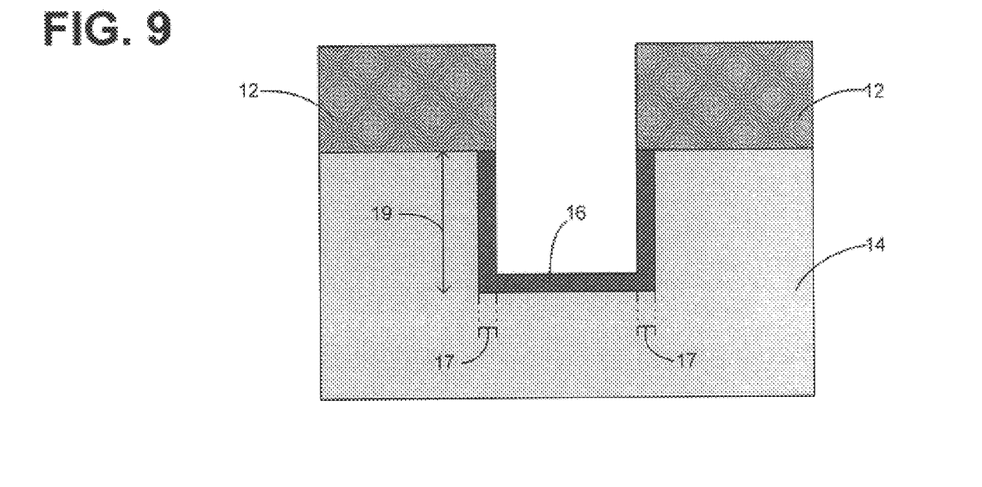
FIG. 9 illustrates an incremental etch step where the modified low-k dielectric is etched.

Referring to FIG. 9, the fourth (and the final) incremental etch step in this example implementation of the present embodiment of the invention is then performed on the structure achieved at the end of the fourth incremental exposure step. The result of this incremental etch step is shown in FIG. 9. As with previous incremental etch steps, the fourth incremental etch step removes most of modified low-k dielectric 16 in the vertical direction, but does not remove a significant amount of the laterally modified low-k dielectric 16 which has encroached under photoresist 12 (the amount of such lateral encroachment was referred to by numeral 17 in FIGS. 2, 4, 6, and 8). As with the previous incremental etch steps, the etchant used in this final incremental etch step is a fluorine based plasma, for example, $CF_4$ or $CH_2F_2$. FIG. 9 shows that after the last step of the process described above, the ultimate target depth 19 is achieved.

Figure 10:
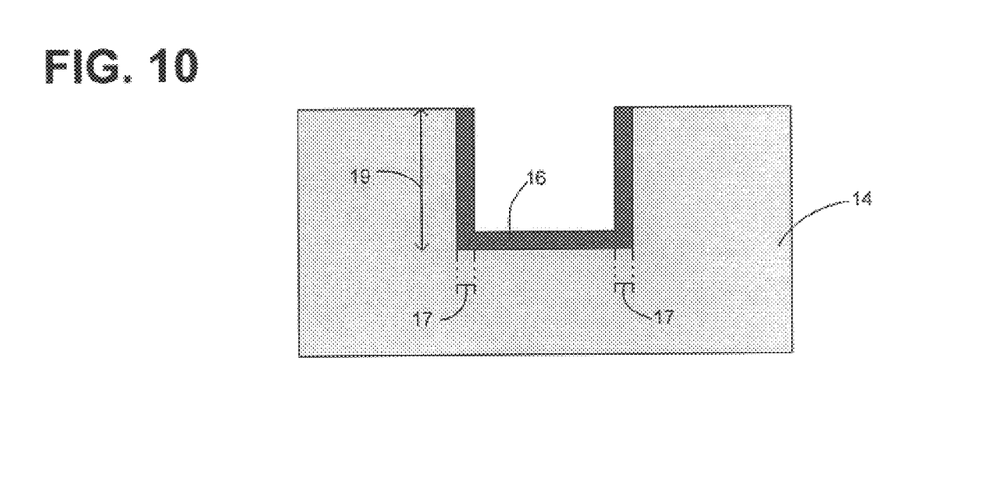
FIG. 10 shows the structure achieved after the last incremental etch step and after stripping of the photoresist from the low-k dielectric.

Referring to FIG. 10, the next step in the present embodiment of the invention is described. In this step, photoresist 12 is stripped using a conventional oxygen plasma or hydrogen plasma or forming gas ($H_2/N_2$) in a manner well known in the art.

Figure 11:
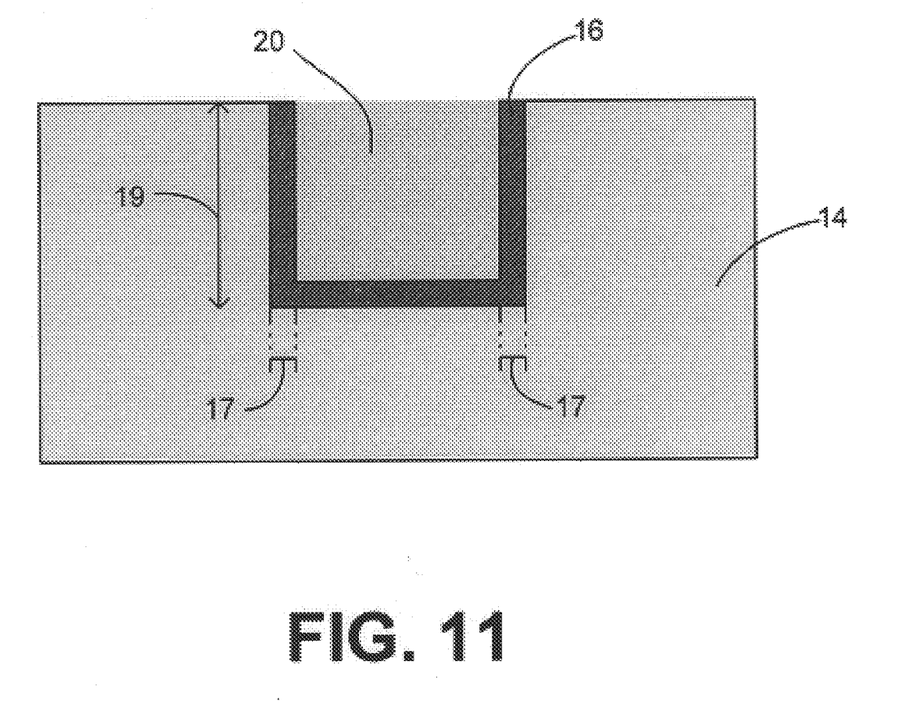
FIG. 11 shows the final structure including the metal filling the etched portion of the low-k dielectric.

Referring to FIG. 11, the next and last step in the present embodiment of the invention is described. In this step the etched portion of modified low-k dielectric 16 is filled with metal 20 in a manner well known in the art. Metal 20 can be copper, aluminum, or another metal. After filling the etched portion of modified low-k dielectric 16 with metal, a chemical mechanical polish ("CMP") is performed to remove the excess metal from the surface of the low-k dielectric. As stated above, modified low-k dielectric 16 exhibits good mechanical strength and results in proper completion of the CMP process.

In the present application, the side or surface of modified low-k dielectric 16 which interfaces metal 20 is referred to as a "first surface" of modified low-k dielectric 16 while the side or surface of modified low-k dielectric 16 which interfaces unmodified low-k dielectric 14 is referred to as a "second surface" of modified low-k dielectric 16.

In another implementation of the present embodiment of the invention the step of exposure of low-k dielectric 14 to E-beams 18 could be "combined" with the etch step. The exposure and the etching could be performed with the same tool in the same system. Performing the exposure and the etching with the same tool in the same system means that the number of incremental exposure and etch steps can be increased as much as desired. The system would perform very fine incremental exposure and etch steps. In this way lateral encroachment 17 of modified low-k dielectric 16 into low-k dielectric 14 could be minimized even further.

Thus it is seen that the present embodiment of the invention maintains the advantages of the low dielectric constant material, including lower intra-line coupling capacitance, lower intra-layer coupling capacitance, lower "RC" delay, and lower power consumption due to the lower capacitance. At the same time, the low dielectric constant material becomes easier to etch and to clean. Moreover, the method and structure disclosed in the present embodiment of the invention improves the mechanical strength of the low-k dielectric material and also overcomes the vulnerability of the low-k dielectric material to various etchants.

Another embodiment of the invention is shown in FIGS. 12 through 16, which illustrate various process steps in the present embodiment of the invention by showing the cross sections of the resulting structures after each process step.

Figure 12:
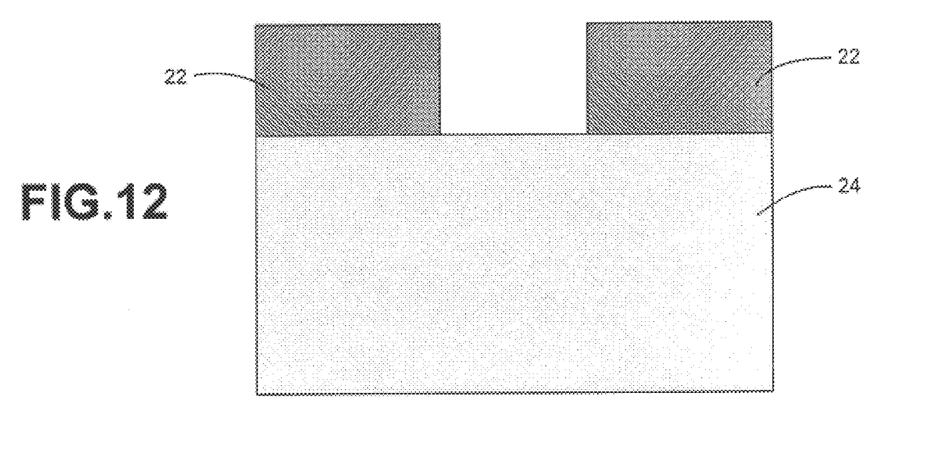
FIG. 12 shows an initial low-k dielectric structure including a photoresist pattern.
Figure 13:
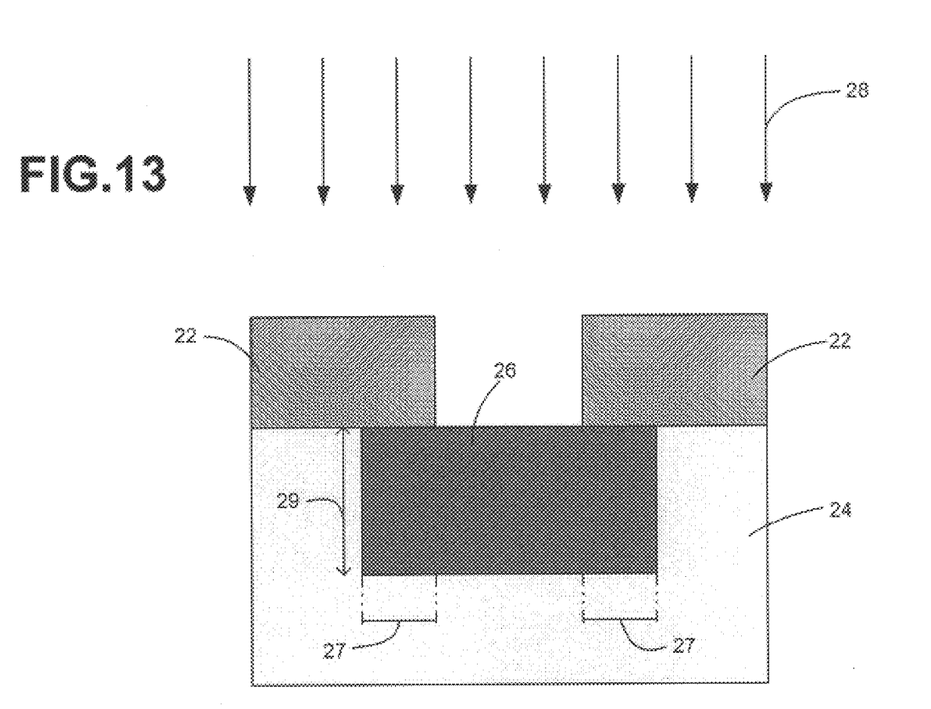
FIG. 13 illustrates a single exposure step where the low-k dielectric is exposed to electron beams.

According to this embodiment of the invention, the process of modifying a low-k dielectric material can be performed in a single exposure step and a single etch step instead of a number of incremental steps. As the present embodiment of the invention's first step in fabricating damascene interconnects using a dielectric with a low dielectric constant, FIG. 12 shows photoresist 22 patterned on top of low-k dielectric 24. Photoresist 22 is used to pattern a desired structure in low-k dielectric 24. As with the previous embodiment described above, in the present embodiment of the invention, low-k dielectric 24 can be hydrogen silsesquioxane (HSQ). FIG. 13 shows the application of electron beams (E-beams) 28 to low-k dielectric 24. By use of E-beams 28, physical properties of low-k dielectric 24 are modified. E-beams 28 break the bond between the silicon and hydrogen in hydrogen silsesquioxane, allowing the hydrogen to "escape". The material that remains after exposure to E-beams 28 is referred to as "modified low-k dielectric", and is generally referred to in FIG. 13 by the numeral 26. As explained above, modified low-k dielectric 26, which remains after application of E-beams 28 is substantially easier to etch and to clean than the initial low-k dielectric 24.

The present embodiment of the invention uses high energy E-beams 28. High energy E-beams are used to modify low-k dielectric 24 in one exposure step. The high energy E-beams permit this embodiment of the invention to modify low-k dielectric 24 in one step since, due to their relatively higher energy, the E-beams penetrate deep into low-k dielectric 24.

Referring to FIG. 13, a specific example of the present embodiment of the invention is now discussed. FIG. 13 illustrates the single exposure step in the present exemplary embodiment. During this step low-k dielectric 24 is exposed to E-beams 28 generated by a high-energy E-beam source. The E-beam source is not shown in any of the Figures. However, commercial E-beam sources are readily available and in fact one advantage of utilizing an E-beam source in the present embodiment is that, because of their wide availability, E-beam sources are relatively inexpensive. Due to exposure to E-beams 28, low-k dielectric 24 is modified down to a certain depth. This depth achieved as a result of the exposure step is generally referred to in FIG. 13 by numeral 29. Thus, depth 29 is the depth of modified low-k dielectric 26 achieved after the single exposure step of the present embodiment.

As discussed above, as a by-product of the exposure step, modified low-k dielectric 26 can encroach laterally under photoresist 22. The amount of lateral encroachment of modified low-k dielectric 26 is generally pointed to by numeral 27 in FIG. 13 and the modified low-k dielectric which is extended under photoresist 22 is referred to as the laterally modified low-k in the present application.

In the present exemplary embodiment depth 29 of modified low-k dielectric 26 is about 0.4 microns after the single exposure step. Lateral encroachment 27 of modified low-k dielectric 26 under photoresist 22 would be about one-half of the 0.4 microns depth, i.e., about 0.2 microns.

Figure 14:
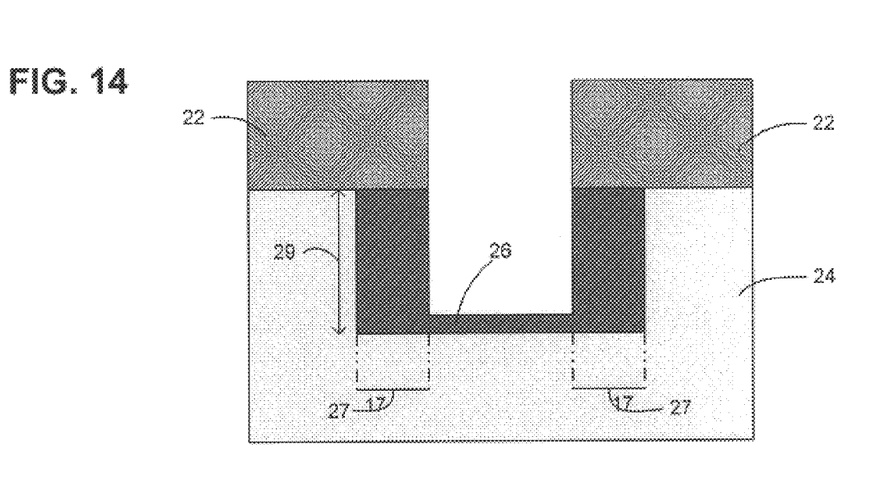
FIG. 14 illustrates a single etch step where the modified low-k dielectric is etched.

Referring to FIG. 14, the etch step is then performed on the structure achieved at the end of the exposure step. The result of this etch step is shown in FIG. 14. The first incremental etch step removes most of modified low-k dielectric 26 in the vertical direction, but does not remove a significant amount of the laterally modified low-k dielectric 26 which has encroached under photoresist 22 (the amount of such lateral encroachment was referred to by numeral 27 in FIG. 13). The etchant used in this etch step in the present embodiment is a fluorine based plasma, for example, $CF_4$ or $CH_2F_2$.

Figure 15:
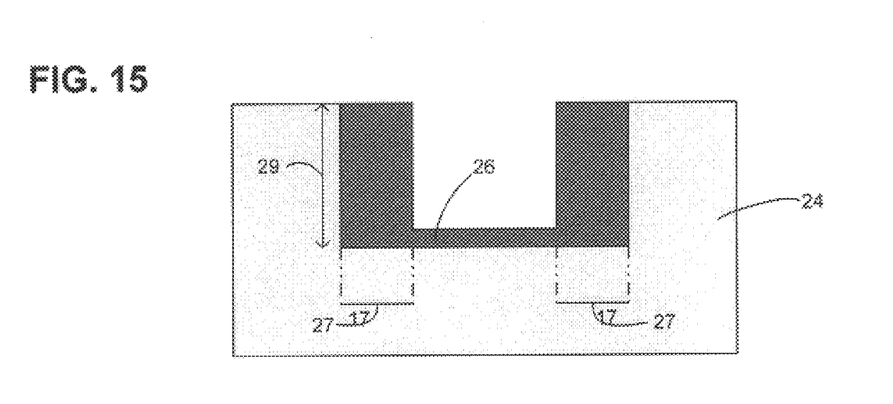
FIG. 15 shows the structure achieved after the last single etch step and after stripping of the photoresist from the low-k dielectric.

Referring to FIG. 15, the next step in the present embodiment of the invention is described. In this step, photoresist 22 is stripped using a conventional oxygen plasma or hydrogen plasma or forming gas ($H_2/N_2$) in a manner well known in the art.

Figure 16:
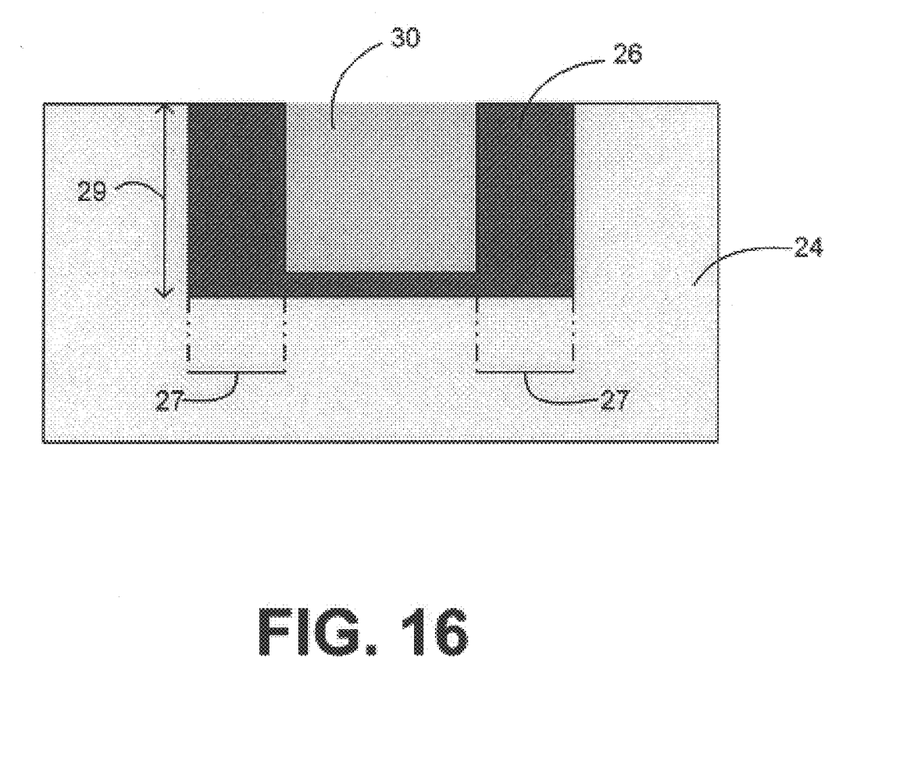
FIG. 16 shows the final structure including metal filling the etched portion of the low-k dielectric.

Referring to FIG. 16, the next and last step in the present embodiment of the invention is described. In this step the etched portion of modified low-k dielectric 26 is filled with metal 30 in a manner well known in the art. Metal 30 can be copper, aluminum, or another metal. After filling the etched portion of modified low-k dielectric 26 with metal, a chemical mechanical polish ("CMP") is performed to remove the excess metal from the surface of the low-k dielectric. As stated above, modified low-k dielectric 26 exhibits good mechanical strength and results in proper completion of the CMP process.

Thus, it is seen that according to this embodiment of the invention, the process of modifying a low-k dielectric material is performed in a single exposure step and a single etch step.

As explained above, the present invention discloses a method for using dielectrics with a low dielectric constant in semiconductor chips while overcoming the disadvantages associated with the use of such dielectrics. The advantages of using low-k dielectric material in the fabrication of integrated circuit structures, such as lower inter-line capacitance, lower inter-layer coupling capacitance, lower "RC" delay, and lower power consumption due to lower capacitance, are maintained. At the same time the disadvantages of using low-k dielectric material in the fabrication of integrated circuit structures, such as the difficulty in etching and cleaning of the low-k dielectric material, and the difficulty in performing the CMP process due to the low mechanical strength of low-k dielectric material are overcome by the method disclosed in the present invention.

From the above description of the invention it is manifest that various techniques can be used for implementing the concepts of the present invention without departing from its scope. For example, the E-beam source can be replaced with an Ion Beam ("I-Beam") source. In that case, I-Beams, instead of E-beams could be used to implement the present invention. Also, various low-k dielectrics other than HSQ, which was used merely as an example in the present application, can be used. Furthermore, the various dimensions and sizes specifically mentioned in the present application can be varied without departing from the scope of the present invention.

Thus, while the invention has been described with specific reference to certain embodiments, a person of ordinary skill in the art would recognize that changes can be made in form and detail without departing from the spirit and the scope of the invention. The described embodiments are to be considered in all respects as illustrative and not restrictive. It should also be understood that the invention is not limited to the particular embodiments described herein, but is capable of many rearrangements, modifications, and substitutions without departing from the scope of the invention.

Thus, fabrication of improved low-k dielectric structures has been described.

What is claimed is:

1. A method comprising steps of:
    exposing to electron beams a target area of a dielectric material, said electron beams converting said dielectric material in said target area into a modified dielectric material;
    etching said modified dielectric material in said target area;
    removing said modified dielectric material from said target area so as to create an etched portion of said dielectric material;
    repeating said steps of exposing, etching, and removing so as to incrementally expand said etched portion, and so as to limit a lateral encroachment of said modified dielectric material into said dielectric material.

2. The method of claim 1 further comprising a step of filling said etched portion with metal after said repeating step.

3. The method of claim 2 further comprising a step of performing a chemical mechanical polish after said filling step.

4. The method of claim 2 wherein said metal is selected from the group consisting of copper and aluminum.

5. The method of claim 1 wherein said dielectric material is hydrogen silsesquioxane.

6. The method of claim 1 wherein said etching step is performed by a fluorine based plasma.

7. A method comprising steps of:

exposing to ion beams a target area of a dielectric material, said ion beams converting said dielectric material in said target area into a modified dielectric material;

etching said modified dielectric material in said target area;

removing said modified dielectric material from said target area so as to create an etched portion of said dielectric material;

repeating said steps of exposing, etching, and removing so as to incrementally expand said etched portion, and so as to limit a lateral encroachment of said modified dielectric material into said dielectric material.

8. The method of claim 7 further comprising a step of filling said etched portion with metal after said repeating step.

9. The method of claim 8 further comprising a step of performing a chemical mechanical polish after said filling step.

10. The method of claim 8 wherein said metal is selected from the group consisting of copper and aluminum.

11. The method of claim 7 wherein said dielectric material is hydrogen silsesquioxane.

12. The method of claim 7 wherein said etching step is performed by a fluorine based plasma.

* * * * *